United States Patent
Ramarao et al.

(10) Patent No.: US 6,940,293 B2
(45) Date of Patent: Sep. 6, 2005

(54) MODELING MILLER EFFECT IN STATIC TIMING ANALYSIS

(75) Inventors: Kumarswamy Ramarao, Santa Clara, CA (US); Matthew J. Page, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/920,765

(22) Filed: Aug. 18, 2004

(65) Prior Publication Data

US 2005/0012509 A1 Jan. 20, 2005

Related U.S. Application Data

(63) Continuation-in-part of application No. 10/305,806, filed on Nov. 27, 2002, now Pat. No. 6,791,343.

(51) Int. Cl.[7] ............................................. G01R 27/26
(52) U.S. Cl. ........................ 324/677; 324/617; 702/65; 716/2
(58) Field of Search ........................ 324/677, 616–619, 324/627, 628, 609, 612, 76.11; 702/64, 65; 716/2

(56) References Cited

U.S. PATENT DOCUMENTS

| | | | |
|---|---|---|---|
| 4,219,770 A | 8/1980 | Weinert | 324/647 |
| 5,864,602 A | 1/1999 | Needle | 379/22.02 |
| 6,522,152 B1 | 2/2003 | Tonti et al. | 324/628 |

OTHER PUBLICATIONS

"Static Crosstalk & IR Drop Delay Analysis," Synopsys, Inc., Sep. 2002, 11 pages.

"Crosstalk Aware Static Timing Analysis Environment," Franzini and Forzan, STMicroelectronics, v. C. Olivettie, 2 20041 Agrate B. (MI), Italy, SNUG Europe 2001, 11 pages, no month available.

"Prime Time SI; Static Crosstalk Analysis," Synopsys, Inc., 2001, 4 pages, no month available.

*Primary Examiner*—Vincent Q. Nguyen
(74) *Attorney, Agent, or Firm*—Garlick Harrison & Markison LLP

(57) ABSTRACT

A method is contemplated. According to the method, capacitances in a first resistance/capacitance (RC) extraction corresponding to a circuit are modified. Each capacitance is modified to estimate Miller effect on that capacitance. A ratio of a total capacitance on a first wire after the modification in the first RC extraction to a total capacitance on the first wire before the modification in the first RC extraction is calculated. Capacitances in a second RC extraction that are coupled to the first wire are modified according to the ratio. The second RC extraction is a reduced extraction as compared to the first RC extraction. A timing analysis is performed for the circuit using the second RC extraction with capacitances modified to estimate Miller effect.

11 Claims, 8 Drawing Sheets

US 6,940,293 B2

MODELING MILLER EFFECT IN STATIC TIMING ANALYSIS

PRIORITY INFORMATION

This application is a continuation of and claims priority to U.S. patent application having an application Ser. No. 10/305,806; filed Nov. 27, 2002 now U.S. Pat. No. 6,791,343, which application is hereby incorporated by reference.

BACKGROUND OF THE INVENTION

1. Field of the Invention

This invention is related to the field of integrated circuit development methodologies and, more particularly, to static timing analysis.

2. Description of the Related Art

Static timing analysis tools are generally used in integrated circuit development methodologies to estimate the timing characteristics of a circuit being developed. The maximum frequency of operation of the circuit may be estimated by assuming "worst case" delays in the circuit elements (that is, the longest delays expected to be experienced in the fabricated integrated circuit, accounting for such factors as process variation, temperature variation, supply voltage variation, etc.). Additionally, proper operation for setup and hold times for clocked storage devices or circuit input/output signals may be estimated using "best case" assumptions for delays in the circuit elements (that is, the shortest delays expected to be experienced, accounting for the above factors).

Typically, static timing analysis tools model the delay due to the wires between circuit elements (the "interconnect delay") as a network of resistors and capacitors. The resistors corresponding to a particular wire have resistances derived from the resistance per unit length of that wire. The capacitors have capacitances derived from the physical characteristics of the wire and nearby wires. That is, wires running along side each other (separated by an insulator) form parallel plate capacitors with a capacitance related to the surface area of the wires. Typically, a resistor-capacitor (RC) extraction is performed to extract the resistance(s) and capacitance(s) for each wire from a layout database for the circuit including the wire. The resistances and capacitances are combined to produce a delay for the wire, and the transition time on the wire (from high to low or low to high) may also be calculated from the RC extraction and the transition time at the circuit that drives the wire.

Unfortunately, the static RC data for a wire may not accurately reflect the delays experienced on that wire. For example, one effect that is not accounted for is the Miller effect. The Miller effect states that the effective capacitance between the terminals of a capacitor is dynamic and is based on the switching state of the terminals. If only one terminal is switching, the effective capacitance may be a first value. If both terminals are switching simultaneously in opposite directions at the same rate, the effective capacitance is twice the first value. If the terminals do not switch simultaneously, or at the same rate, the effective capacitance is greater than the first value but less than twice the first value. If both terminals switch simultaneously in the same direction at the same rate, the effective capacitance may be zero. If the terminals do not switch simultaneously, or at the same rate, but do switch in the same direction, the effective capacitance is greater than zero but less than the first value.

Thus, the delay on a given wire may be a dynamic value based on the switching state of nearby wires, and may vary substantially from the delay calculated using the RC extraction values. Some timing analysis tools attempt to account for Miller effect using "timing windows". That is, a window of time around the switching on a given wire is defined, and the tool determines if other wires are switching during the timing window. This approach may help account for Miller effect, but may be complex and time consuming. Furthermore, for high frequency integrated circuit designs, the timing windows may overlap substantially, further complicating the analysis. Another attempt to model Miller effect may be to assume a "rule of thumb" for Miller effect and modify all capacitances for all wires in the integrated circuit by the same rule of thumb. Such a rule of thumb approach may not provide a very accurate Miller effect accounting for a given wire.

SUMMARY OF THE INVENTION

In one embodiment, a method is contemplated. According to the method, capacitances in a first resistance/capacitance (RC) extraction corresponding to a circuit are modified. Each capacitance is modified to estimate Miller effect on that capacitance. A ratio of a total capacitance on a first wire after the modification in the first RC extraction to a total capacitance on the first wire before the modification in the first RC extraction is calculated. Capacitances in a second RC extraction that are coupled to the first wire are modified according to the ratio. The second RC extraction is a reduced extraction as compared to the first RC extraction. A timing analysis is performed for the circuit using the second RC extraction with capacitances modified to estimate Miller effect.

BRIEF DESCRIPTION OF THE DRAWINGS

The following detailed description makes reference to the accompanying drawings, which are now briefly described.

Figure 1:
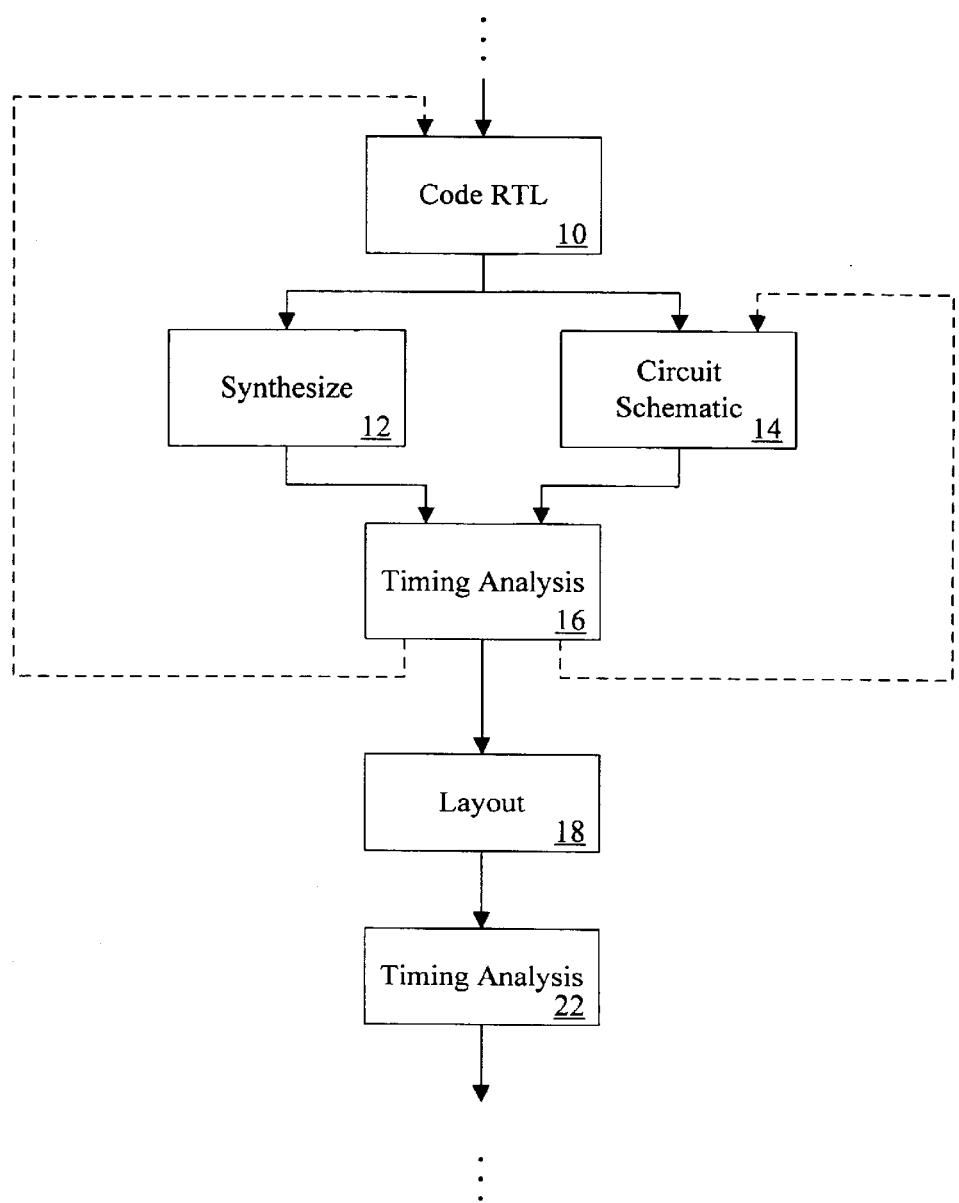
FIG. 1 is a flowchart illustrating one embodiment of a portion of a design flow for an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Design Flow Overview

Turning now to FIG. 1, a block diagram illustrating one embodiment of a portion of a design flow is shown.

Once the integrated circuit design has been divided into one or more blocks of functionality (more briefly referred to herein as partitions), the designer may code a register-transfer level (RTL) description of each partition (reference numeral 10). Any hardware design language (HDL) may be used as the language for the RTL description (e.g. VHDL, Verilog, etc.). The RTL description may comprise one or more files per partition, as desired.

The designer may choose to use a synthesis tool to synthesize the RTL description to a netlist (reference numeral 12). The synthesis tool takes the RTL description and a library of cells (predesigned circuits which have one or more inputs and produce one or more outputs as a specified function of one or more inputs) and generates a netlist of cells, linked together in such a way as to provide the functionality described in the RTL description. On the other hand, the designer may choose to design the circuits manually, using a circuit schematic/schematic capture tool (reference numeral 14). The designer may use a combination of circuit schematic design and synthesis for a given block.

The resulting netlists and schematic capture data may be provided to a timing analysis tool to estimate the timing of the design (i.e. to estimate whether or not the design will meet timing requirements for the integrated circuit to operate at a desired clock frequency) (reference numeral 16). Based on the timing results, the designer may modify the RTL description and/or the circuit schematics to improve the timing (illustrated in FIG. 1 with the dotted lines from the timing analysis (reference numeral 16) to the RTL coding (reference numeral 10) and the circuit schematics (reference numeral 14)). At the point illustrated by reference numeral 16, delay from the wires interconnecting the cells and other circuitry may be estimated (since the layout has not yet been performed) rather than extracted.

At some point, the estimated timing calculated at reference numeral 16 may be near the timing goals for the integrated circuit, and the layout of the netlists may be performed (reference numeral 18). Alternatively, layout work may start in parallel with timing analysis, or may be performed before any timing analysis is performed, as desired. Generally, the layout includes placing the cells called out in the netlist into physical positions within the integrated circuit layout, and routing the wires which interconnect the cells using the wiring layers of the integrated circuit layout. The circuit schematics produced using the circuit schematic tools may already be laid out within the circuit, but may be placed within the overall layout and the inputs and outputs of the circuit may be connected to wires, similar to the cells.

The timing analysis tool may be executed again (reference numeral 22), using interconnect delays for the wires extracted from the integrated circuit layout. Additionally, the extracted interconnect delays may be modified to account for Miller effect, as described in more detail below, by modifying capacitances extracted from the layout data. While the present description modifies the capacitances for timing analysis using layout data, other embodiments may modify the estimated RC data used at block 16 in a similar fashion.

Integrated Circuit

Figure 2:
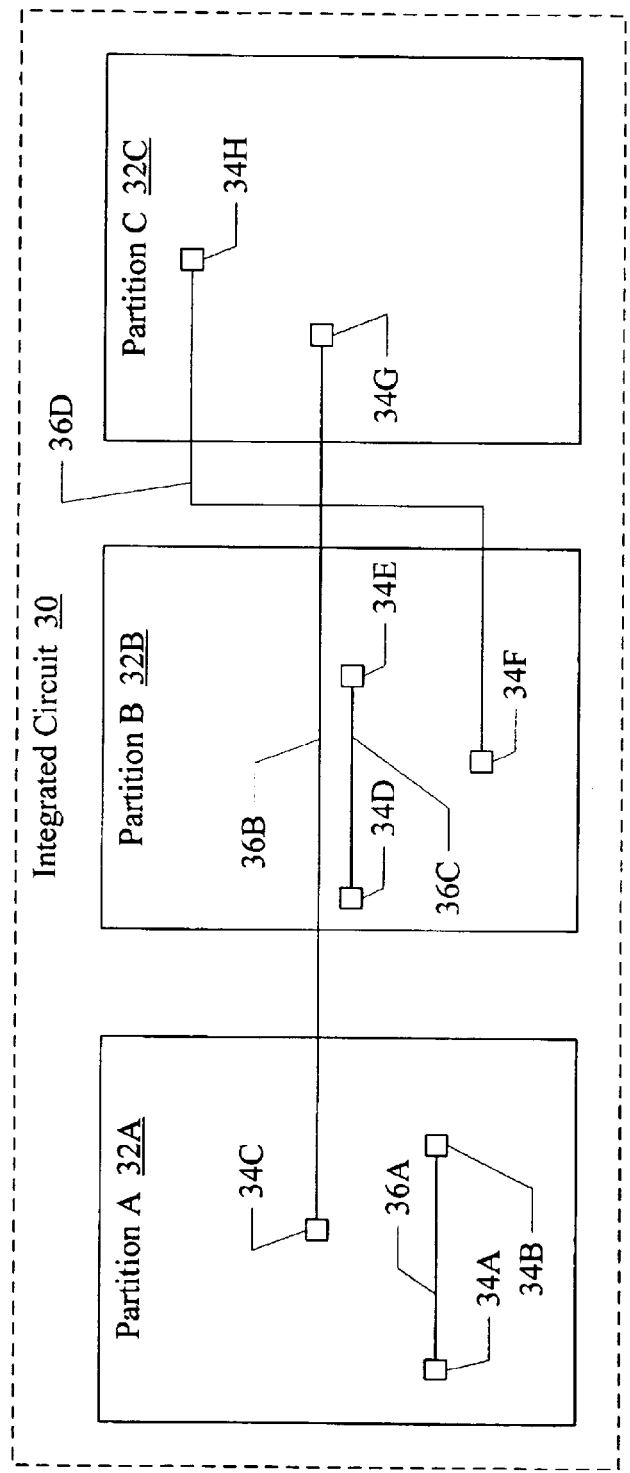
FIG. 2 is a block diagram of one embodiment of an integrated circuit.

Turning now to FIG. 2, a block diagram of one embodiment of an integrated circuit 30 is shown. The integrated circuit 30 includes a plurality of partitions (e.g. partitions 32A, 32B, and 32C shown in FIG. 2, although more or fewer partitions may be included). The partition 32A includes circuit elements 34A, 34B, and 34C. Similarly, the partition 32B includes circuit elements 34D, 34E, and 34F; and the partition 32C includes circuit elements 34G and 34H. In the illustrated embodiment, the circuit element 34A is coupled to the circuit element 34B with a wire 36A. The circuit element 34C is coupled to the circuit element 34G with a wire 36B. The circuit element 34D is coupled to the circuit element 34E with a wire 36C, and the circuit element 34F is coupled to the circuit element 34H with a wire 36D.

Each of the partitions 32A–32C may represent a circuit included in the integrated circuit 30. The circuitry of the integrated circuit 30 may be divided into the partitions 32A–32C by design choice. Typically, the partitions 32A–32C are made small enough that the various tools used in the design flow (e.g. the timing tools, layout tools, synthesis tools, etc.) may effectively and/or efficiently operate on the partitions. For example, timing analysis may be performed at the partition level (that is, each partition 32A–32C may be analyzed separately by the timing analysis tool). Additionally, the partitions may be abstracted to perform timing analysis for the integrated circuit as a whole (typically referred to as "chip level" timing analysis).

Each partition 32A–32C includes various circuit elements which implement the circuit represented by that partition 32A–32C (e.g. the circuit elements 34A–34H shown in FIG. 2). Circuit elements may be any circuitry (e.g. logic circuits, memory circuits, custom-designed circuits, etc.) having one or more inputs and one or more outputs. The inputs and outputs of the circuit elements are coupled via wires (e.g. the wires 36A–36D shown in FIG. 2).

Many wires may have one source and one or more sinks. Tristatable wires may have more than one source, with enable circuitry that selects which source drives the wire at any given point in time, and one or more sinks. Wires may be of various types. Local wires are wires that have both source(s) and sink(s) within a given partition. Wires 36A and 36C in FIG. 2 may be examples of local wires. Global wires have at least one source/sink in one partition and at least one other source/sink in another partition. Wires 36B and 36D may be examples of global wires. A global wire may be a feedthrough wire for a given partition if the wire passes through that partition (i.e. the wire is routed over the integrated circuit area that is included in the partition) but does not have a source or sink within the partition. The wire 36B may be an example of a feedthrough wire for the partition 32B. Additionally, wires may be characterized as signal wires or non-switching wires. A signal wire (also referred to as a switching wire) carries a logical signal which may change state during use. A non-switching wire carries a steady state voltage (e.g. power or ground) and is not designed to change state during use. Non-switching wires may experience voltage change during use (e.g. due to noise, ground bounce, power supply droop, etc.) but do not actively change state during normal operation.

Wires which run near each other may form capacitors, as mentioned above. If the wires are both switching wires, the capacitance may be subject to Miller effect. The effect may occur for all types of wires (e.g. local wires, global wires, feedthrough wires, or combinations thereof). A methodology for estimating Miller effect for timing analysis by modifying the capacitances between wires is described in more detail below.

Figure 3:
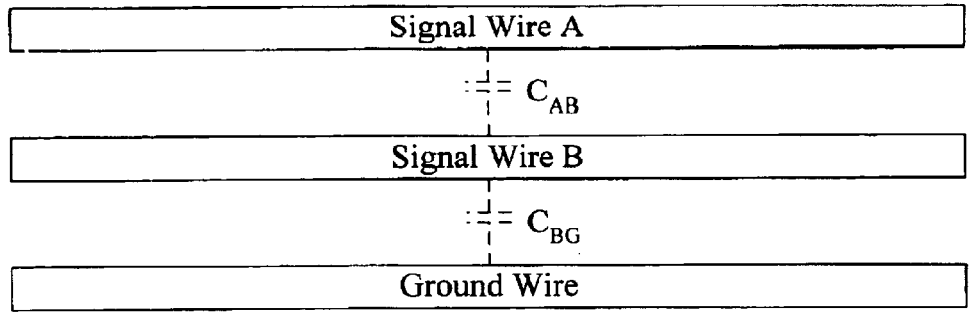
FIG. 3 is a block diagram of one embodiment of a set of wires and capacitances therebetween.

Turning now to FIG. 3, a block diagram illustrating several exemplary wires (a signal wire A, a signal wire B, and a ground wire) is shown. Any of the wires 36A–36D may be examples of the signal wire A and/or the signal wire B, for example. The signal wire A and the signal wire B may be viewed as the plates of a parallel plate capacitor $C_{AB}$ (shown in dotted form since it is not actually part of the circuit, but rather represents the capacitance between the signal wires A and B). The capacitance of the capacitor $C_{AB}$ may generally be determined based in part on the surface area of the wires that are exposed to each other, the insulator between the wires, etc. Similarly, the signal wire B and the ground wire may be viewed as the plates of a parallel plate capacitor $C_{BG}$ (shown in dotted form since it is not actually part of the circuit, but rather represents the capacitance between the signal wire B and the ground wire).

Additionally, the wires have a resistance per unit length (based on the cross sectional area of the wire, the material used to form the wires, etc.). The combination of the resistance and the capacitance of the wires forms a delay for a signal transitioning on the wire. The capacitances may be subject to the Miller effect, if the signals on the wires on both sides of the capacitance are switching at similar times. Other capacitances may not be subject to the Miller effect. For example, the capacitance of the capacitor $C_{AB}$ may be subject to the Miller effect, since both signal wire A and signal wire B are switching wires. On the other hand, the capacitance of the capacitor $C_{BG}$ may not be subject to the Miller effect, since the ground wire is not a switching wire.

As part of timing analysis, a tool is typically used to analyze the circuitry forming a partition to extract an resistor/capacitor (RC) network which represents the resistance and capacitance of each wire. That is, the RC network may model the resistance and capacitance of the corresponding wire. The term "RC extraction" may generally include any analysis of data representing a circuit to generate an RC model of a wire or wires in the circuit. For example, RC extraction tools may take the layout database (the data which represents the wires laid out on the integrated circuit area, typically as sets of polygons) and/or schematic capture data or netlists as input. The layout database is typically represented in GDSII format. Various RC extraction tools exist and may be used. For example, in one embodiment, the StarRCXT tool (formerly available from Avanti, now acquired by Synopsys, Inc. of Mountain View, Calif.) may be used. Generally, the RC extraction tool outputs a file representing an RC network for the wires. For example, the file may be a text file listing the resistors and capacitors, their values, and the connection of their terminals.

An RC extraction may be a "full" extraction or a "reduced" extraction. A full extraction provides an RC network for the wires at the highest granularity that the tool may provide (or at a granularity selected by the user). While the full extraction provides a more accurate model, it also provides a large amount of data that may reduce the efficiency of the timing tool, especially for large partitions. In some cases, the resources of the computer executing the timing tool (e.g. memory) may be exhausted by the large size of the RC data and a timing analysis may not be completed. Accordingly, reduced RC extractions may often be used. A reduced RC extraction uses an algorithm to reduce the RC network to an equivalent network (or approximately equivalent network) which provides approximately the same delay but uses fewer RC components. Various algorithms may be used. For example, frequency domain algorithms map the RC network to the frequency domain and remove the high frequency components, then map back to the reduced RC network. Time domain algorithms may also be used. However, in the reduced RC extraction, some information is lost which may impact the ability to adjust for Miller effect. For example, in the StarRCXT tool, the reduced RC extraction includes capacitors having one terminal coupled to ground. Thus, the ability to locate capacitors which have both terminals coupled to signal wires may be lost.

Figure 4:
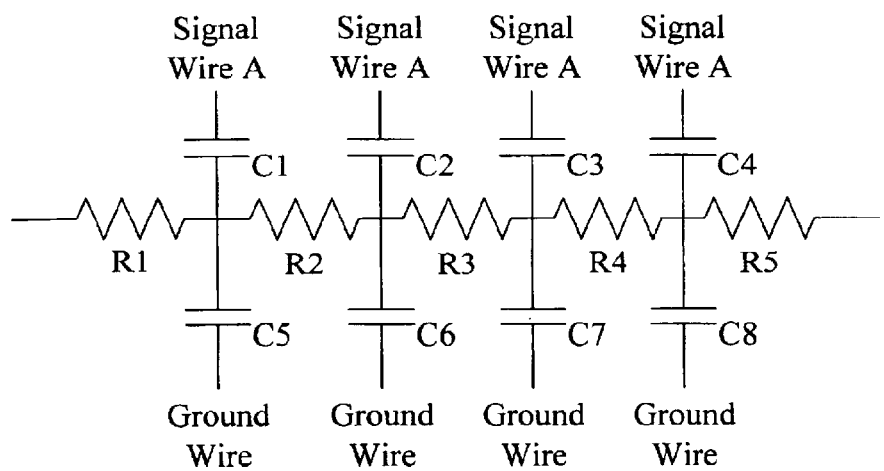
FIG. 4 is a circuit diagram illustrating one embodiment of an RC extraction of a wire illustrated in FIG. 3.

FIG. 4 is an example of an RC network resulting from a full RC extraction for the signal wire B in FIG. 3. The resistance of the signal wire B is represented as a series of resistors R1, R2, R3, R4, and R5. Each resistor may have a different value (depending, e.g., on the length of wire represented by the resistor, the cross section of the wire, etc.) or the resistors may have the same value if equal lengths and cross sections of wire are represented. At the node between each resistor, capacitors representing a portion of the capacitance between the signal wire B and neighboring wires (e.g. the signal wire A and the ground wire) are shown. For example, capacitors C1, C2, C3, and C4 are coupled between the signal wire B and the signal wire A. The total capacitance of the capacitors C1, C2, C3, and C4 may be the capacitance of the capacitor $C_{AB}$ in FIG. 3. Similarly, the capacitors C5, C6, C7, and C8 are coupled between the signal wire B and the ground wire. The total capacitance of the capacitors C1, C2, C3, and C4 may be the capacitance of the capacitor $C_{BG}$ in FIG. 3.

Figure 5:
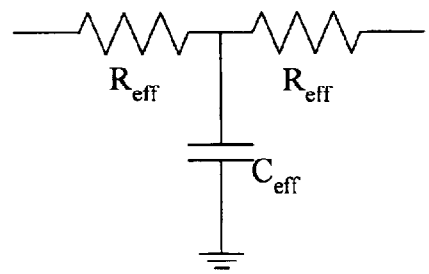
FIG. 5 is a circuit diagram illustrating another embodiment of an RC extraction of a wire illustrated in FIG. 3.

FIG. 5 is an example of a reduced RC extraction for the signal wire B. The resistance of the signal wire B may be represented by two series resistors $R_{eff}$. The capacitance on the signal wire B may be represented by a capacitor $C_{eff}$ coupled between the signal wire B and ground. While two series resistors and a capacitor are shown as the reduced RC extraction in FIG. 5, more resistors and capacitors may be used to model a given wire in the reduced extraction. However, the reduced RC extraction may include fewer components than the corresponding full RC extraction.

The RC network of FIG. 5 includes fewer components than the RC network of FIG. 4. Additionally, the RC network of FIG. 5 lumps capacitance between two signal wires (e.g. the capacitors C1, C2, C3, and C4 in FIG. 4) that may be subject to Miller effect with capacitance between a signal wire and the ground wire (e.g. the capacitors C5, C6, C7, and C8 in FIG. 4) that may not be subject to Miller effect. While a ground wire is shown in the example of FIG. 3, any wire that is held in steady state may be used (e.g. wires held at the power supply voltage or any other voltage).

Miller Effect Estimation

Generally, the Miller effect estimation methodology described herein makes the assumption, for a signal wire, that a neighboring signal wire causes Miller effect for the capacitance between the neighboring signal wire and the signal wire. The methodology modifies the capacitances in a full RC extraction based on this assumption, and calculates a ratio of the total capacitance on the signal wire after the modification to the total capacitance before the modification. The methodology modifies capacitances in a reduced RC extraction according to the ratio for the wire to which each capacitance is coupled, and uses the modified, reduced RC extraction for timing analysis.

The amount of Miller effect assumed for a given capacitance may vary depending on other properties of the two signal wires between which the capacitance exists. Capacitances between a signal wire and a non-switching wire may not be modified (i.e. no Miller effect may be assumed). Capacitances between signal wires that are part of the same bus may be modified by a different factor than those that are not part of the same bus.

The Miller effect assumption may vary depending on the type of timing analysis that is to be performed. For example, if "maximum delay" analysis is to be performed (that is, analysis to determine the delay through the circuit paths using "worst case" delay assumptions for the circuit elements accounting for such factors as process variation, temperature variation, supply voltage variation, etc.), the Miller effect assumption may be that the neighboring wire is switching "against" the signal wire (that is, switching in the opposite direction). If "minimum delay" analysis is to be performed (that is, analysis to determine the delay through circuit paths using "best case" assumptions for delays in the circuit elements accounting for the above factors), the Miller effect assumption may be that the neighboring wire is switching "with" the signal wire (that is, switching in the same direction).

Figure 6:
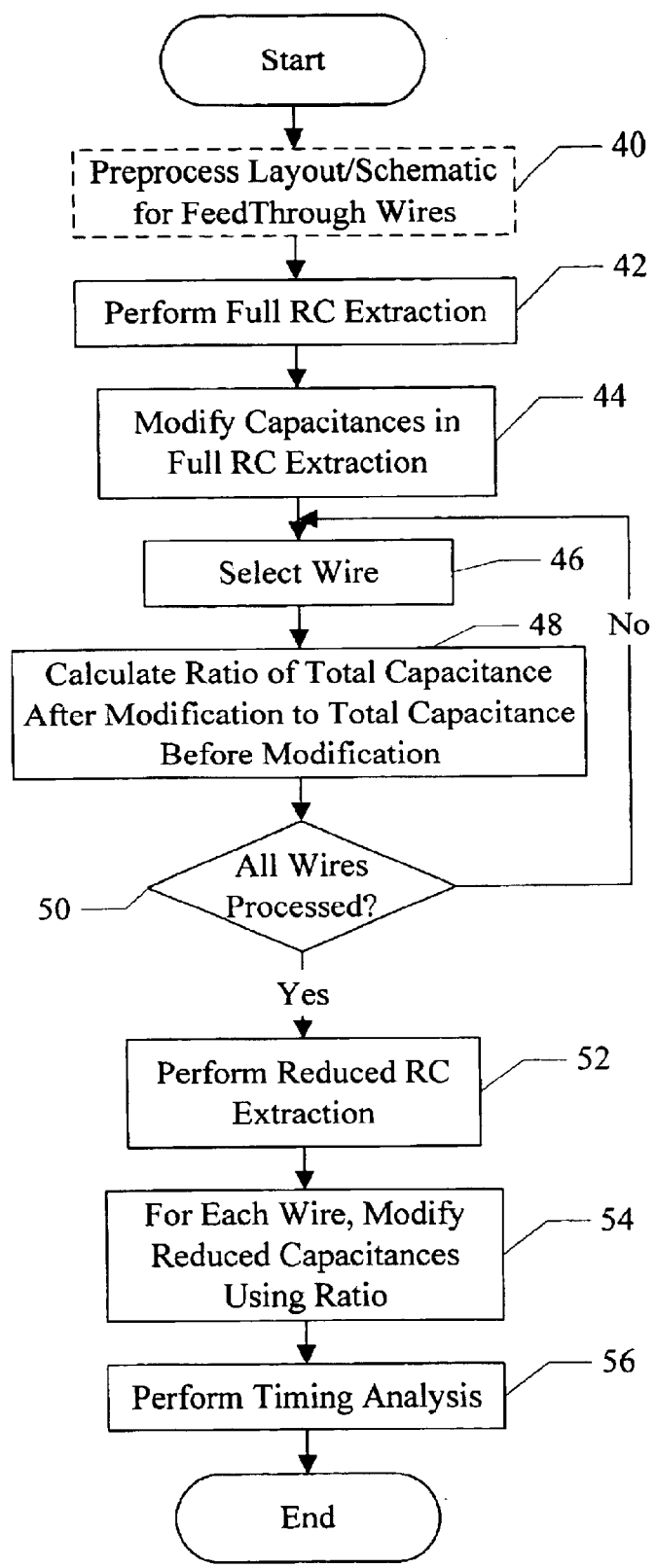
FIG. 6 is a flowchart illustrating one embodiment of a timing analysis method that includes estimating Miller effect.

Turning now to FIG. 6, a flowchart is show illustrating the Miller effect methodology for use at the partition level for timing analysis. While the blocks are shown in a particular order in FIG. 6 for ease of understanding, other orders may be used. Additionally, blocks may be performed in parallel.

Optionally, the layout database, schematic capture data, and/or netlists may be preprocessed to ensure that feedthrough wires are retained in the RC extraction for the partition (block 40). Since the feedthrough wires have no source or sink in the partition, these wires may be lost in an RC extraction, in some embodiments. The preprocessing modifies the layout database, schematic capture data, and/or netlists to ensure that the feedthrough wires are retained. For example, a pair of inverters may be inserted on the feedthrough wires, thus providing sources and sinks within the partition for the feedthrough wires.

The methodology may then perform a full RC extraction using the optionally preprocessed data (block 42). The full RC extraction may be performed using an RC extraction tool (e.g., such as StarRCXT mentioned above). Alternatively, the RC extraction may be the function of another tool such as a timing analysis tool.

The methodology may modify the capacitances in the full RC extraction to estimate Miller effect (block 44). Various embodiments of the modification block 44 are shown in more detail below with regard to FIGS. 7 and 8.

For each wire in the partition, the methodology may calculate a ratio of the total capacitance on the wire after the modification of block 44 to the total capacitance on the wire before the modification. This operation is illustrated in FIG. 6 via blocks 46, 48, and 50. In block 46, a wire is selected. In block 48, the ratio for that wire is calculated. In decision block 50, a determination is made as to whether or not all wires have been processed. If all wires have not been processed, the next wire is selected. If all wires have been processed, the methodology continues at block 52. The total capacitance may be the sum of the capacitances coupled to the selected wire.

The RC extraction tool may be used to perform a reduced RC extraction for the partition (block 52). It is noted that the reduced RC extraction may be performed earlier in the methodology, as desired. For example, the reduced RC extraction may be performed at any previous point in the methodology, such as when the full RC extraction is performed.

For each wire, the methodology may multiply each capacitance in the reduced RC extraction that is coupled to that wire by the ratio calculated for that wire in block 48 (block 54). The resulting RC extraction data, modified in block 54, may be used to perform timing analysis (block 56). A timing analysis tool may be used to implement block 56. Any timing analysis tool may be used. For example, in one embodiment, the PathMill tool from Synopsys, Inc. may be used.

Figure 10:
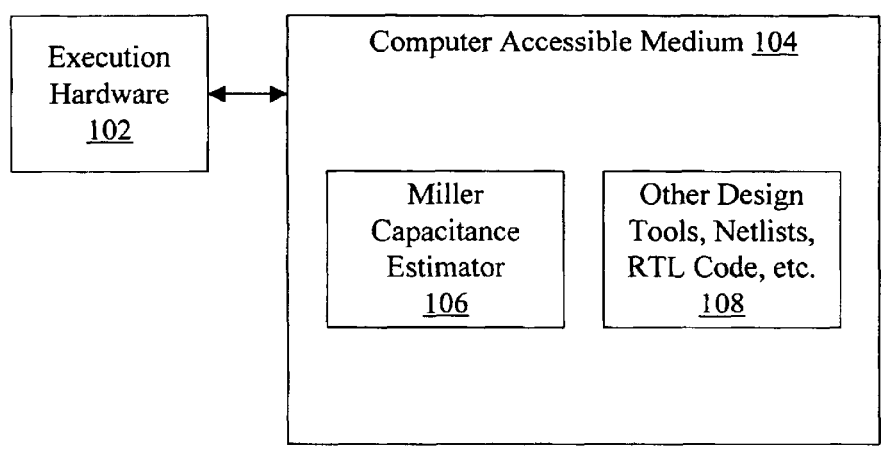
FIG. 10 is a block diagram of one embodiment of a computer system including a computer accessible medium.

It is noted that a portion of the methodology shown in FIG. 6 may be implemented as one or more instruction sequences forming a Miller effect estimator tool (e.g. reference numeral 106 shown in FIG. 10). For example, the Miller effect estimator tool may include one or more instructions which, when executed, perform one or more of blocks 40, 44, 46, 48, 50, and 54. For block 44, the instructions may perform the embodiments illustrated in FIGS. 7 and 8, or a combination thereof. Additionally, the Miller effect estimator tool may include one or more instructions which call the RC extraction tool to perform blocks 42 and 52, and which call the timing analysis tool to perform block 56. In other embodiments, the Miller effect estimator tool may also perform blocks 42, 52, and 56, as desired.

Figure 7:
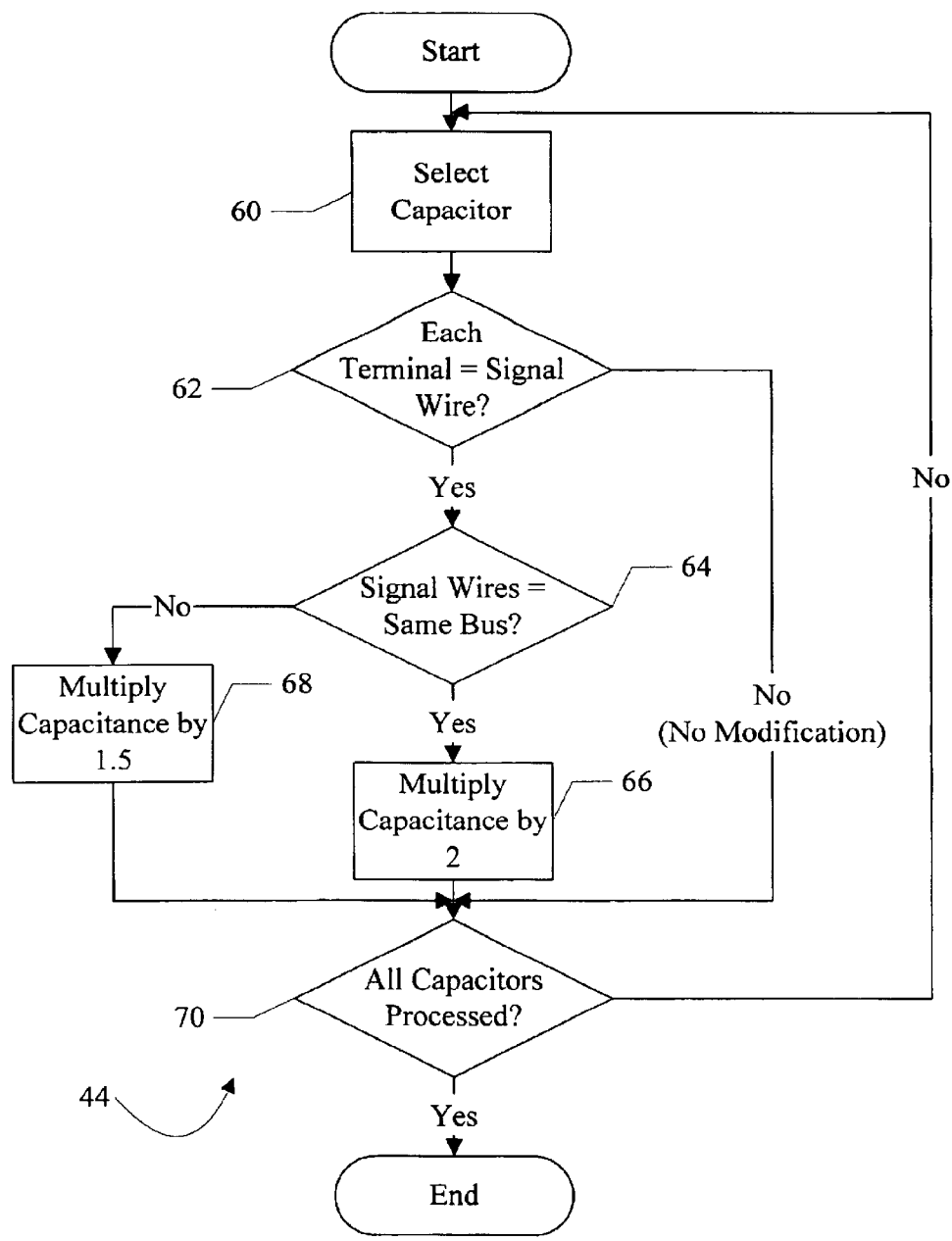
FIG. 7 is a flowchart illustrating one embodiment of modifying capacitances to estimate Miller effect for maximum delay timing analysis.

Turning next to FIG. 7, a flowchart illustrating one embodiment of modifying capacitances in the full RC extraction (block 44 from FIG. 6) is shown. The embodiment of FIG. 7 may be used to modify capacitances for maximum delay timing analysis. The order of blocks shown in FIG. 7 is merely exemplary and other orders may be used in other embodiments.

The next capacitor in the RC extraction is selected (block 60). If at least one of the terminals of the capacitor is not coupled to a signal wire (that is, the terminal is coupled to a non-switching wire), then no modification is made (decision block 62, "no" leg). If both terminals of the capacitor are coupled to signal wires (decision block 62, "yes" leg), and the two signal wires are part of the same bus (decision block 64, "yes" leg), the capacitance of the capacitor is multiplied by 2 (block 66). On the other hand, if the two signal wires are not part of the same bus (decision block 64, "no" leg), the capacitance is multiplied by 1.5 (block 68). If all capacitors have not yet been processed (decision block 70, "no" leg), the next capacitance is selected (block 60). Otherwise, the block 44 ends.

The embodiment of FIG. 7 assumes that signal wires that are part of the same bus are concurrently switching in opposite directions at the same rate. As used herein, a bus refers to two or more wires that are used to transmit a multi-bit value from a source to one or more destinations. In many cases, the bits on a bus will be switched from one value to the next approximately concurrently. Additionally, the wires forming the bus are typically driven with similar circuitry, and typically have approximately the same length and load, and so the bits will tend to switch at a similar rate. Accordingly, a worst case assumption of switching concurrently in opposite directions at the same rate may closely approximate actual operation (in the worst case) of the signals on a bus, in such cases. This assumption translates to doubling the capacitance for the capacitor (block 66). In other embodiments, factors of about two may be used (e.g. anywhere in a range of 1.8 to 2.2).

Signal wires which are not part of the same bus may be statistically less likely to switch concurrently and/or at the same rate. Therefore, the factor used to multiply the capacitance in such cases may be less than that used for the signal wires that are part of the same bus. In this example, a factor of 1.5 is used. Other embodiments may use other factors of about 1.5 (e.g. anywhere in a range of 1.3 to 1.7).

It is noted that other embodiments may not attempt to distinguish between signal wires that are part of the same bus or not. Such embodiments may use a factor of about 2 for all wires, for example. Other embodiments may use a factor of somewhat less than 2 to account for cases in which the switching of the signals is not concurrent.

Figure 8:
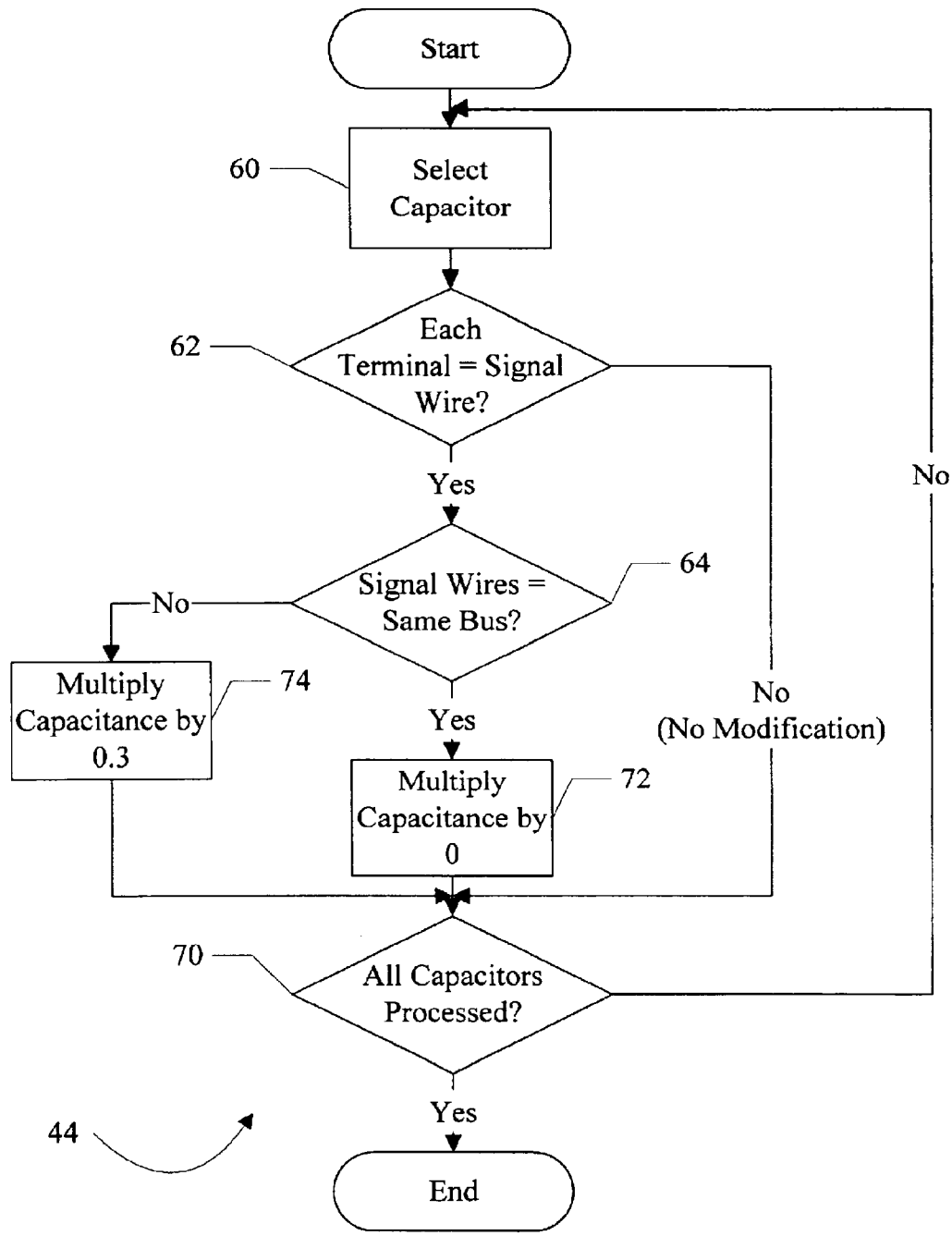
FIG. 8 is a flowchart illustrating one embodiment of modifying capacitances to estimate Miller effect for minimum delay timing analysis.

Turning now to FIG. 8, a flowchart illustrating a second embodiment of modifying capacitances in the full RC extraction (block 44 from FIG. 6) is shown. The embodiment of FIG. 8 may be used to modify capacitances for minimum delay timing analysis. The order of blocks shown in FIG. 8 is merely exemplary and other orders may be used in other embodiments.

Similar to the embodiment of FIG. 7, each capacitor is selected in the RC extraction (blocks 60 and 70) and no modification is made if at least one of the terminals of the capacitor is not coupled to a signal wire (decision block 62, "no" leg). If both terminals of the capacitor are coupled to signal wires (decision block 62, "yes" leg), and the two signal wires are part of the same bus (decision block 64, "yes" leg), the capacitance of the capacitor is multiplied by 0 (block 72). On the other hand, if the two signal wires are not part of the same bus (decision block 64, "no" leg), the capacitance is multiplied by 0.3 (block 74).

The embodiment of FIG. 8 assumes that signal wires that are part of the same bus are concurrently switching in the same direction at the same rate, for reasons similar to those discussed above with regard to FIG. 7. This assumption translates to zeroing the capacitance for the capacitor (block 72). That is, since both terminals of the capacitor are switching in the same direction at the same rate, the voltage change across the capacitor is zero. In other embodiments, factors of about zero may be used (e.g. anywhere in a range of 0.2 to 0).

Signal wires which are not part of the same bus may be statistically less likely to switch concurrently and/or at the same rate. Therefore, the factor used to multiply the capacitance in such cases may be greater than that used for the signal wires that are part of the same bus (for minimum delay analysis). In this example, a factor of 0.3 is used. Other embodiments may use other factors of about 0.3 (e.g. anywhere in a range of 0.1 to 0.5).

It is noted that other embodiments may not attempt to distinguish between signal wires that are part of the same bus or not. Such embodiments may use a factor of about 0 for all nets, for example. Other embodiments may use a factor of somewhat greater than 0 to account for cases in which the switching of the signals is not concurrent. It is further noted that, in other embodiments, modifying capacitances for minimum delay analysis and for maximum delay analysis may be combined (e.g. the flowcharts of FIGS. 7 and 8 may be combined, performing both blocks 68 and 74 on the "no" leg of decision block 64 and performing both blocks 66 and 72 on the "yes" leg of decision block 64).

The embodiment of FIGS. 6–8 has been described for estimating Miller effect in partition-level timing analysis. The Miller effect methodology may also be used in chip-level timing analysis. Performing an RC extraction for global wires at the chip level may be problematic (as processing the entire layout database may be problematic). However, an RC extraction for global wires at the chip-level may be performed using a "tunneling" technique, in one embodiment. As used herein, tunneling refers to defining a cross sectional area about a wire and traversing the wire with the cross sectional area, capturing any wires within the "tunnel" thus created. For example, a circular area having a selected radius may be used. Any radius may be used in various embodiments, although a radius of about 0.5 micron to 1.0 micron may be used in some embodiments.

The tunneling may be performed using, for example, a design rules checking (DRC) tool. For example, in one embodiment, the Hercules tool from Avanti, now acquired by Synopsys, Inc., may be used. Generally, a DRC tool is designed to check that design rules for a semiconductor manufacturing process are met by an integrated circuit design (e.g. minimum spacing between lines at a given layer of the circuit, etc.). The DRC tool generally receives as input a set of rules and a layout database, and outputs any circuit structures in the layout database which violate the rules. By creating a rule that specifies a minimum spacing about a global wire of a certain size (e.g. 0.5 micron to 1.0 micron), the wires within that spacing (within the "tunnel") may be detected as violations by the DRC tool and thus may be output to the file. The output file, including only the wires within the tunnels, may be smaller than the chip-level layout database. An RC extraction may thus be performed on the output file, and Miller estimation may be performed in a manner similar to the partition level analysis.

Figure 9:
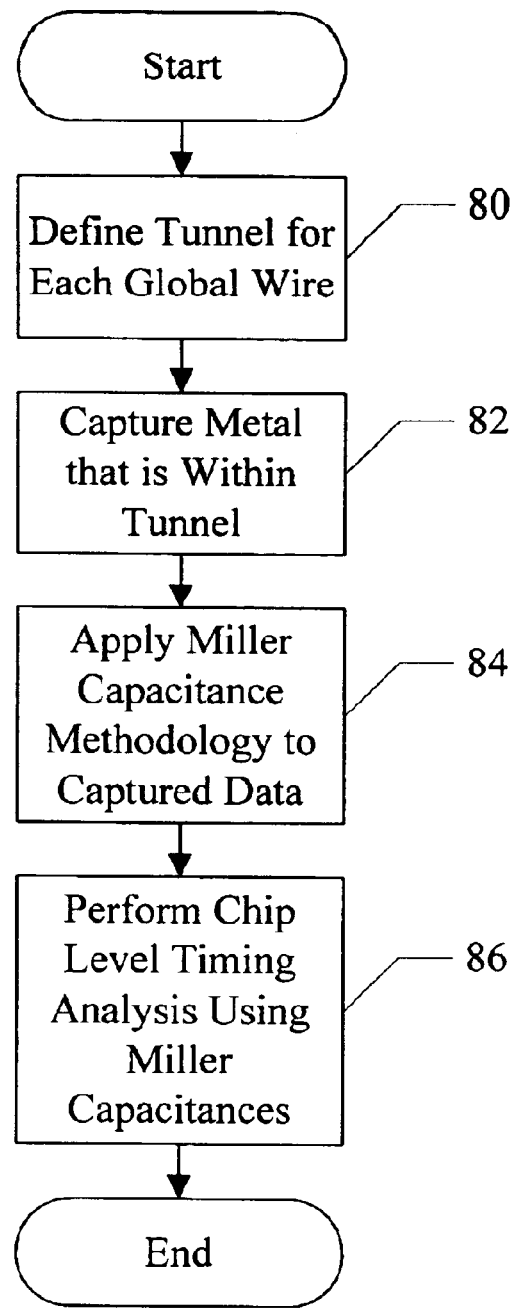
FIG. 9 is a flowchart illustrating a chip-level timing analysis method that estimates Miller effect.

FIG. 9 is a flowchart illustrating one embodiment of the Miller effect methodology at the chip-level. A tunnel may be defined for each global wire for which Miller effect is desired (block 80). The DRC tool may be used to capture metal (wires) that are within the tunnel and output that metal to a file (block 82). The output of the DRC tool may be extracted with the extraction tool, and the Miller capacitance methodology may be applied to the output of the extraction tool (block 84). That is, the operation as shown in FIG. 6 may be performed on the output of the DRC tool. Chip-level timing analysis may then be performed using the capacitances adjusted to estimate Miller effect.

It is noted that, in some embodiments, the blocks of FIG. 9 may be implemented by one or more instructions in the Miller effect estimator tool 106. The instructions, when executed, may implement the operation illustrated in the flowchart of FIG. 9 in addition to that shown in FIG. 6.

Computer System

Turning next to FIG. 10, a block diagram of a computing system 100 is shown. In the embodiment of FIG. 10, the computing system 100 includes execution hardware 102 and a computer accessible medium 104 coupled thereto. The computer accessible medium 104 stores the Miller capacitance estimator 106, and may include other design tools, netlists, RTL code, etc. (reference numeral 108).

The execution hardware 102 may include any hardware for executing the Miller capacitance estimator 106. For example, the execution hardware 102 may be a computer system coupled to the computer accessible medium 104 via a network or other external peripheral connection. Alternatively, the execution hardware 102 may comprise one or more processors, memory, and other peripherals incorporated into a computer system which also includes the computer accessible medium 104.

The computer accessible medium 104 may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Numerous variations and modifications will become apparent to those skilled in the art once the above disclosure is fully appreciated. It is intended that the following claims be interpreted to embrace all such variations and modifications.

What is claimed is:

1. A method comprising:
   modifying a capacitance in a full resistance/capacitance (RC) extraction corresponding to a circuit, the capacitance modified to estimate Miller effect on the capacitance by:

(i) determining if both terminals of a capacitor representing the capacitance are coupled to signal wires;
(ii) determining if the signal wires are of a same bus, if both terminals of the capacitor are coupled to signal wires;
(iii) multiplying the capacitance by a first value, if the signal wires are of the same bus;
(iv) multiplying the capacitance by a second value, if the signal wires are of a different bus; and
performing a reduced RC extraction using the modified capacitance value.

2. The method as recited in claim 1 wherein the first value has an approximate value of 2 and the second value has an approximate value of 1.5, when the signal wires are switching in opposite directions.

3. The method as recited in claim 2 wherein the capacitance is not modified if at least one of the terminals of the capacitor is not coupled to a signal line.

4. The method as recited in claim 3 further comprising performing a maximum delay timing analysis for the circuit.

5. The method as recited in claim 4 further comprising performing modification on plurality of capacitances of the circuit and determining a ratio of total capacitance after the modifying to total capacitance before the modifying to perform the reduced RC extraction.

6. The method as recited in claim 1 wherein the first value has a range of 1.8–2.2 and the second value has a range of 1.3–1.7, when the signal wires are switching in opposite directions.

7. The method as recited in claim 1 wherein the first value has an approximate value of 0 and the second value has an approximate value of 0.3, when the signal wires are switching in a same direction.

8. The method as recited in claim 7 wherein the capacitance is not modified if at least one of the terminals of the capacitor is not coupled to a signal line.

9. The method as recited in claim 8 further comprising performing a minimum delay timing analysis for the circuit.

10. The method as recited in claim 9 further comprising performing modification on plurality of capacitances of the circuit and determining a ratio of total capacitance after the modifying to total capacitance before the modifying to perform the reduced RC extraction.

11. The method as recited in claim 1 wherein the first value has a range of 0–0.2 and the second value has a range of 0.1–0.5, when the signal wires are switching in a same direction.

* * * * *

UNITED STATES PATENT AND TRADEMARK OFFICE
CERTIFICATE OF CORRECTION

PATENT NO.         : 6,940,293 B2
APPLICATION NO.    : 10/920765
DATED              : September 6, 2005
INVENTOR(S)        : Kumarswamy Ramarao et al.

It is certified that error appears in the above-identified patent and that said Letters Patent is hereby corrected as shown below:

Title Page, Item (63): delete "Continuation-in part" and insert --Continuation--.

Signed and Sealed this

Thirtieth Day of December, 2008

JON W. DUDAS
*Director of the United States Patent and Trademark Office*